United States Patent [19]
Leighton et al.

[11] Patent Number: 6,121,800
[45] Date of Patent: Sep. 19, 2000

[54] IMPEDANCE MATCHED, VOLTAGE-MODE H-BRIDGE WRITE DRIVERS

[75] Inventors: John D. Leighton, Anoka, Minn.; Eric Groen, Sac City, Iowa

[73] Assignee: Lucent Technologies, Inc., Murray Hill, N.J.

[21] Appl. No.: 09/152,869

[22] Filed: Sep. 14, 1998

Related U.S. Application Data

[60] Provisional application No. 60/091,958, Jul. 7, 1998.

[51] Int. Cl.[7] ........................................ H03B 1/00
[52] U.S. Cl. ........................................ 327/110; 327/423
[58] Field of Search ........................................ 327/110, 423, 327/424, 494, 495, 496, 497, 587, 588

[56] References Cited

U.S. PATENT DOCUMENTS

| | | | |
|---|---|---|---|
| 5,126,603 | 6/1992 | Hattori | 307/571 |
| 5,379,209 | 1/1995 | Goff | 363/132 |
| 5,550,502 | 8/1996 | Aranovsky | 327/423 |

*Primary Examiner*—Jeffrey Zweizig
*Attorney, Agent, or Firm*—Kinney & Lange, P.A.

[57] ABSTRACT

A write driver for an inductive load includes load terminals for connection to an inductive load, and a driver circuit responsive to first and second control signals to supply a drive current through the load in respective first and second directions. A voltage-mode H-bridge connected to the load terminals is operable to selectively supply a voltage across the load terminals and head. Program means operates the voltage-mode H-bridge for a predetermined time period following initiation of the respective first and second control signal to provide a voltage across the load terminals which quickly raises the write current to a steady state condition. Ringing is suppressed by employing an impedance-matched H-bridge for the driver circuit, the impedance-matched H-bridge having an impedance matched to the impedance of a transmission line connecting the load to the terminals.

14 Claims, 1 Drawing Sheet

6,121,800

IMPEDANCE MATCHED, VOLTAGE-MODE H-BRIDGE WRITE DRIVERS

CROSS-REFERENCE TO RELATED APPLICATION

This application claims benefit of Provisional application Ser. No. 60/091,958 filed Jul. 7, 1998 for "Advanced Writer Using Impedance Matching And Voltage-mode Writing Techniques" by John D. Leighton and Eric Groen.

BACKGROUND OF THE INVENTION

This invention relates to drivers for inductive devices, and particularly to write drivers for inductive magnetic heads.

Inductive magnetic heads are commonly used in magnetic disk drives for writing data to magnetic disks. The magnetic head is operated by driving a write current through the inductive coil of the magnetic head, and reversing the direction of the current to reverse the magnetic field generated by the head. Field reversals induce changes in magnetic dipoles on the disk to represent data. While several types of current driver circuits are commonly used to drive current in opposite directions through the coil, one common circuit is an H-bridge. An H-bridge employs four transistor switches operated to direct write current through alternating pairs of the switches of the circuit. For optimal performance, the rise time of the write current at transitions should be as short as possible. Extended rise times adversely affect the field reversal characteristics and the recorded data. Current overshoots are often avoided because current overshoots usually generate undesirable undershoot, thereby creating ringing and increasing the settling time of the write current. While current overshoot is not necessarily an undesirable phenomenon, as overshoot often leads to quicker rise times, the undershoot delays settling time of the steady state write current thereby prohibiting implementation of short write current pulses.

Various techniques have been employed to suppress ringing in write driver circuits. Many of these techniques degrade the write current. For example, shunt impedances placed in parallel to the head coil suppress ringing, at the cost of diverting write current through the shunt impedance, making the diverted current unavailable to perform a write function at the head.

As technology of magnetic disk drives advances, it becomes increasingly desirable to increase data recording frequency, to thereby increase data density on the disk. Increased data frequency requires shorter and more rapid rise times to the write current pulses with quicker settling to the steady state write current value and without ringing. The present invention is directed to a technique for minimizing the rise time of the write current pulse and to reduce settling time.

BRIEF SUMMARY OF THE INVENTION

One aspect of the invention is directed to a write driver that includes first and second load terminals for connection to an inductive load, such as a write head of a disk drive. A driver circuit is connected to the first and second load terminals and is responsive to a first control signal to supply a drive current through the load in a first direction and is responsive to a second control signal to supply the drive current through the load in a second, opposite direction. A voltage-mode H-bridge is connected to the first and second load terminals to selectively supply a voltage across the load terminals and head. Program means is responsive to the first and second control signals to operate the voltage-mode H-bridge to supply the voltage to the respective first and second load terminals for a predetermined time period following a data transition (represented by an initiation of the respective first and second control signal) to quickly raise the write current to a steady state condition.

An optional feature of the voltage-mode H-bridge is the operation of the program means to provide the voltage to the load terminals for a first predetermined time period to shorten the rise time of the write current at the transition, and then reverse the voltage for a second predetermined time period to correct overshoot of the write current and assure formation of a narrow overshoot pulse and rapid settling to the steady-state write current of the driver.

Another aspect of the invention is directed to a write driver that includes first and second load terminals for connection to an inductive load. The inductive load includes an inductive write head of a disk drive and a transmission line of predetermined impedance connected to the write head for connection to the first and second load terminals. An impedance-matched driver circuit is connected to the first and second load terminals and is responsive to a first control signal to supply drive current through the load in a first direction and is responsive to a second control signal to supply drive current through the load in a second, opposite direction. The driver circuit has an impedance matched to the impedance of the transmission line to suppress ringing.

One form of the impedance-matched driver circuit is an impedance-matched H-bridge. The impedance comprises a first impedance connected between first load terminal and the junction of two transistors forming one leg of the H-bridge, and a second impedance connected between the second load terminal and the junction of two transistors forming the other leg of the H-bridge. Preferably, the first and second impedances have substantially equal impedance values.

In a preferred form of the invention, the impedance-matched driver circuit and the voltage-mode H-bridge are used together for optimal performance. The transmission line to the head has a predetermined propagation time of signals between the load terminals and the head. For optimal performance, the predetermined time period of operation of the voltage-mode H-bridge is no greater than twice the predetermined propagation time of the transmission line, thereby avoiding reflection of differential voltage supplied by the voltage-mode H-bridge. Moreover, the impedance-matched driver circuit is responsive to the respective first and second control signals to supply drive current to the respective first and second load terminals and sink drive current from the respective second and first load terminals for a period of time of about twice the predetermined time period of operation of the voltage-mode H-bridge.

BRIEF DESCRIPTION OF THE DRAWINGS

The sole FIGURE is a circuit diagram of an H-bridge for driving an inductive magnetic head in accordance with the presently preferred embodiment of the present invention.

DETAILED DESCRIPTION

Figure 1:
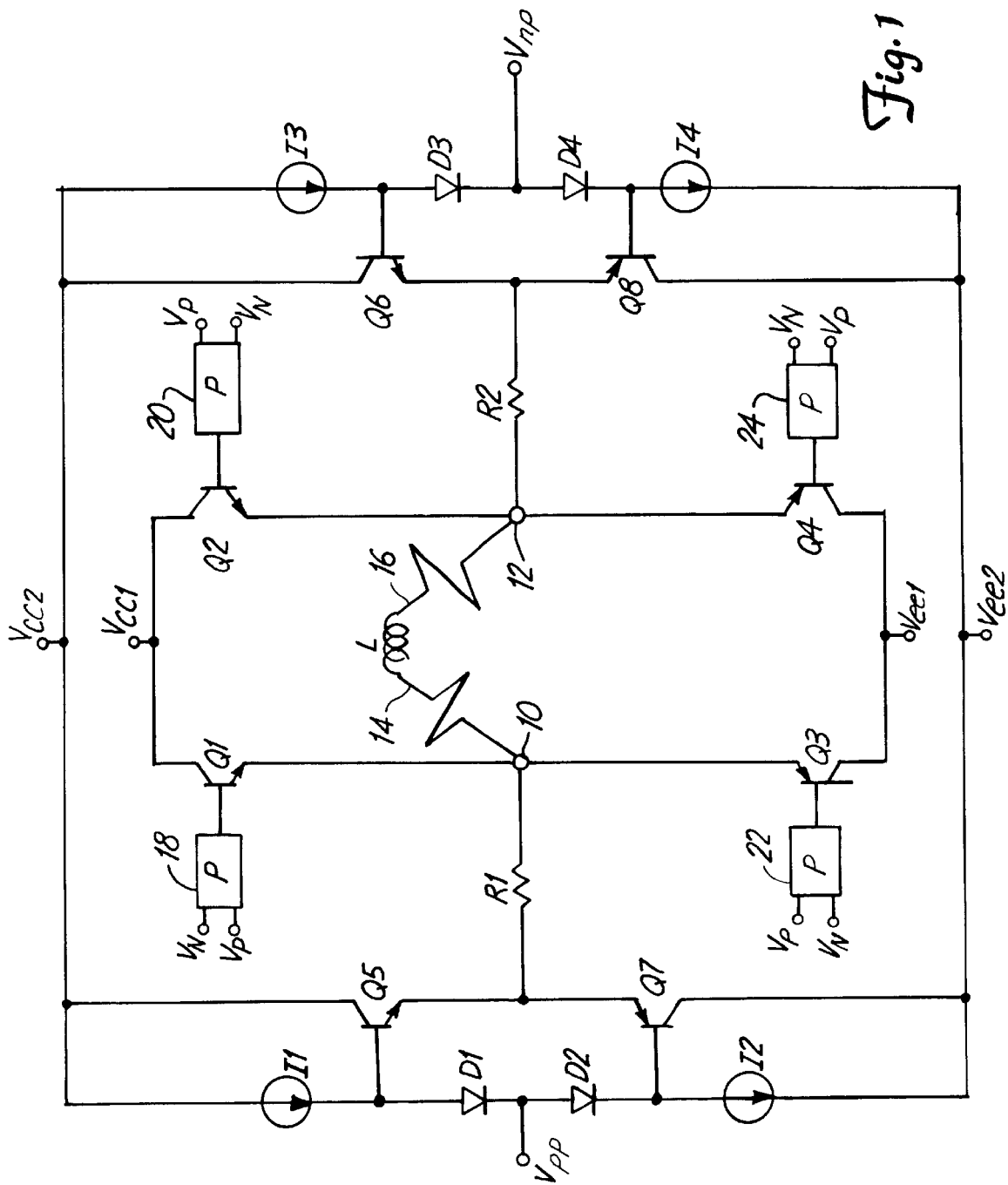

The sole FIGURE illustrates a voltage-mode H-bridge comprising as transistors Q1, Q2, Q3 and Q4 connected in the form of an H with transistors Q1 and Q3 forming one leg of the H, transistors Q2 and Q4 forming the other leg of the H, and coil L of the inductive magnetic head connected across the center of the H via a transmission line represented by lines 14 and 16 connected to load terminals 10 and 12. In the embodiment illustrated in drawing, transistors Q1 and Q2 are npn transistors having their collectors connected to a positive voltage source Vcc1, and transistors Q3 and Q4 are pnp transistors having their collectors connected to negative voltage source Vee1. The emitters of transistors Q1 and Q3 are connected together and to load terminal 10, and the emitters of transistor Q2 and Q4 are connected together and to load terminal 12. The transmission line may be any type of transmission line well known in the art, such as a twisted pair transmission line. However, transmission line 14, 16 has a known impedance and a known propagation time to propagate a signal between terminal 10 and one side of head L and between terminal 12 and the other side of head L. Ordinarily, lines 14 and 16 are of equal length and therefor have equal impedances and equal propagation times. The bases of transistors Q1–Q4 are connected to respective program units 18–24, which in turn are connected to input control terminals Vp and Vn to receive control signals representing data to be written to the disk adjacent head L.

An impedance-matched H-bridge comprises transistors Q5, Q6, Q7 and Q8 connected in the form of an H, with transistors Q5 and Q7 forming one leg of the H and transistors Q6 and Q8 forming the other leg of the H. In the embodiment illustrated in drawing, transistors Q5 and Q6 are npn transistors having their collectors connected to a positive voltage source Vcc2, and transistors Q7 and Q8 are pnp transistors having their collectors connected to negative voltage source Vee2. The emitters of transistors Q5 and Q7 are connected together and to one side of impedance-matching resistor R1. The emitters of transistors Q6 and Q8 are connected together and to one side of impedance-matching resistor R2. The opposite sides of resistors R1 and R2 are connected to respective load terminals 10 and 12.

Diodes D1 and D2 are arranged such that the cathode of diode D1 is connected to the base of transistor Q5 and to one side of current source I1, and the anode of diode D1 is connected to the cathode of diode D2 and to input control terminal Vpp to receive a first programmed control signal. The anode of diode D2 is connected to the base of transistor Q7 and to one side of current sink I2. The opposite sides of current source I1 and current sink I2 are connected to respective positive and negative voltage sources Vcc2 and Vee2. Likewise, diodes D3 and D4 are arranged such that the cathode of diode D3 is connected to the base of transistor Q6 and to one side of current source I2, and the anode of diode D3 is connected to the cathode of diode D4 and to input control terminal Vnp to receive a second programmed control signal. The anode of diode D4 is connected to the base of transistor Q8 and to one side of current sink I4. The opposite sides of current source I3 and current sink I4 are connected to respective positive and negative voltage sources Vcc2 and Vee2.

The operation of the circuit may be explained by first describing the steady state operation of the circuit and the impedance-matched H-bridge of transistors Q5–Q8. Transistors Q5 and Q7, diodes D1 and D2, current source I1 and current drain I2 operate as a class AB driver to either drive current into terminal 10 or sink current from terminal 10, depending on the state of the first control signal at Vpp. Likewise, transistors Q6 and Q8, diodes D3 and D4, current source I3 and current drain I4 operate as a class AB driver to either drive current into terminal 12 or sink current from terminal 12, depending on the state of the second control signal at Vnp. As is well known in the art, the control signals at Vpp and Vnp are complementary, so that when one control signal is positive, the other is negative. Thus, with transistors Q5 and Q8 conducting and transistors Q6 and Q7 non-conducting, current from source I1 flows though terminal 10, transmission line 14, head L, transmission line 16, terminal 12 to sink I4. Conversely, with transistors Q6 and Q7 conducting and transistors Q5 and Q8 non-conducting, current from source I3 flows though terminal 12, transmission line 16, head L, transmission line 14, terminal 10 to sink I2. The change of state of transistors Q5–Q8 is established by switching the control signal at Vpp/Vnp between high and low.

Assume transistors Q6 and Q7 are conducting current through head L in the direction from terminal 12 to terminal 10. Upon reversal of the control signal Vpp/Vnp, transistors Q6 and Q7 are turned off and transistors Q5 and Q8 begin to conduct. It will be appreciated to those skill in the art that without other circuit elements, parasitic capacitances associated with transistors Q5–Q8 will alter the rise time of the write current upon a transition. Additionally, voltage overshoot conditions generate undesirable undershoot conditions that delay the settling time of the steady state write current. One aspect of the present invention is directed to the voltage-mode H-bridge comprising transistors Q1–Q4 for rapid rise time to overcome the problems of the delayed rise time of the transistor H-bridge formed by transistors Q5–Q8.

A data transition is manifest in a reversal of the program control signal at Vpp and Vnp and the control signal Vp and Vn at the program devices 18–24. The control signals at Vpp and Vnp are analog signals that operate to switch transistors Q5–Q8 of the impedance-matched H-bridge when the voltage of Vpp becomes greater than Vnp, and vice versa. The voltage of the control signals at Vpp and Vnp is programmable to a selected value. The control signals at Vp and Vn are digital signals associated to the signals at Vpp and Vnp to switch transistors Q1–Q4 of the voltage-mode H-bridge when control signals at Vpp and Vnp operated the impedance-matched H-bridge. Therefore, both H-bridges switch polarity simultaneously. For example, upon a transition of the control signal to turn on (make conducting) transistors Q5 and Q8 of the impedance-matched H-bridge and transistors Q1 and Q4 of the voltage-mode H-bridge, transistors Q2, Q3, Q6 and Q7 are turned off (made non-conducting). Just prior to the transition, the voltage at terminal 12 had been slightly positive and the voltage at terminal 10 had been slightly negative due to the conducting states of transistors Q6 and Q7 (transistors Q2 and Q3 being non-conducting). As a result of the transition, the voltage at terminal 10 quickly rises from slightly negative toward positive supply voltage Vcc1, due to the conducting condition of transistor Q1. At the same time, the voltage at the junction between transistors Q5 and Q7 also rises to positive supply voltage Vcc2. If voltages Vcc1 and Vcc2 are equal, the voltage appearing across resistor R1 is zero. Simultaneously, the voltage at terminal 12 drops from slightly positive to the negative supply voltage at Vee1 due to the conducting condition of transistor Q4, and the voltage at the junction between transistors Q6 and Q8 drops to the programmed negative voltage at Vnp so a voltage drop of |Vee1-Vnp| appears across resistor R2. With a high voltage differential across the impedance-matched H-bridge (equal to Vcc+|Vnp|), current through coil L rapidly reverses and begins to flow from terminal 10 to terminal 12.

Similarly, upon a transition of the control signal to turn on (make conducting) transistors Q6 and Q7 of the impedance-matched H-bridge and transistors Q2 and Q3 of the voltage-mode H-bridge, transistors Q1, Q4, Q5 and Q8 are turned off (made non-conducting) and the voltages at terminal 12 and at the junction between transistors Q6 and Q8 quickly rise to positive supply voltage Vcc for a zero voltage drop across resistor R2, while the voltage at terminal 10 drops to Vee1 and the voltage at the junction between transistors Q5 and Q7 drops to the programmed negative voltage at Vpp creating a voltage drop of |Vee1-Vpp| across resistor R1. With a high voltage differential across the impedance-matched H-bridge (equal to Vcc+|Vpp|), current through coil L rapidly reverses and begins to flow from terminal 12 to terminal 10. It will be appreciated that the voltage differential across the impedance-matched H-bridge is programmable by the value of the voltage of the control signal at Vpp/Vnp.

In a preferred form of the invention, program units 18–24 are predrivers programmed to provide short pulses having a duration between about 0.3 and 1.5 nanoseconds. In one specific form, program units provide pulses having a duration of less than about 0.6 nanoseconds, which is less than twice the propagation time of transmission line 14,16. Program units 18 and 24 operate respective transistors Q1 and Q4 to conduction at the initiation of a control signal operating transistors Q5 and Q8 to conduction. The program units operate the respective transistor Q1 and Q4 to a non-conduction state at the end of the programmed time period. Since transistors Q5 and Q8 are already on, supplying drive current to terminal 10 and sinking drive current from terminal 12, the circuit assumes a steady state condition of the H-bridge formed by transistors Q5–Q8. Thus, at the end of the programmed time period, all transistors Q1–Q4 of the voltage-mode H-bridge are non-conductive and head L is driven solely by the drive current provided by the impedance-matched H-bridge of transistors Q5–Q8, until a reversal of the control voltage Vp|Vn to reverse current direction through coil L.

In the form of the program units thus far described, two of the program units operate the respective transistors to impose a high differential voltage across the terminals 10 and 12 for a programmed period of time to provide a rapid rise time in the write current. In accordance with a modification of the present invention, the program units are programmed such that two of the units operate the respective transistors during a first time period commencing with a data transition to provide a rapid rise time to the write current, and the other two units are operated for a shorter, second period of time to reverse the polarity of the voltage-mode H-bridge to drive the write current out of any overshoot condition after termination of the fast rise. Hence, the reversal of voltage permits the write current be driven to an overshoot condition during the first time period and assures the write current be quickly driven back to a steady state condition to prevent any undershoot condition and the ringing associated therewith. More particularly, transistors Q5 and Q8 may be operated to impose a short (for example, 0.5 nanosecond) positive voltage at terminal 10 and negative voltage at terminal 12. At or after the transistors Q5 and Q8 are turned off, program units 20 and 22 operate transistors Q7 and Q6 to provide a shorter (for example, 0.1 nanosecond) negative voltage on terminal 10 and positive voltage on terminal 12, thereby driving the voltages at terminals 10 and 12 to near zero as the steady state current source provided by transistors Q1 and Q8 become fully operational.

It is desirable that the time period of operation of the voltage-mode H-bridge not be greater than twice the propagation time delay of the transmission line represented by lines 14 and 16. For example, if the propagation time delay to transmit a signal from a terminal 10 or 12 to head L is 0.3 nanoseconds, it is preferred the programed period of operation (for both the first and second periods, if used) of the voltage-mode H-bridge not be greater than 0.6 nanoseconds. By limiting the period of operation of the voltage-mode H-bridge to less than 0.6 nanoseconds (in the example), assurance is made that the write driver of the present invention is in the steady state mode by the time any signal can be propagated from a terminal to the head and reflected back to the terminal. Thus, the short duration of the fast rise time voltage-mode H-bridge assures that the voltage placed at the terminals by the voltage-mode H-bridge does not introduce unwanted ringing into the signal. It will also be appreciated that the voltage-mode H-bridge represents a high impedance to the write driver when transistors Q1–Q4 are all made nonconducting. Hence, the voltage-mode H-bridge does not interfere with the operation of the impedance-matched H-bridge after completion of the predetermined time period of operation of the voltage-mode H-bridge.

The impedance-matched H-bridge formed by transistors Q5–Q8 should be operated for at least twice as long as the duration of operation of the voltage-mode H-bridge. Thus, where the voltage-mode H-bridge is operated for 0.6 nanoseconds, the impedance-matched H-bridge is operated for at least 1.2 nanoseconds (including 0.6 nanoseconds overlap with the voltage-mode H-bridge). This permits operating the write driver to write a transition each 1.2 nanoseconds, resulting in transition recording frequencies of nearly one gigahertz.

One feature of the invention resides in the impedance matching of the H-bridge formed by transistors Q5–Q8 to the impedance of transmission line 14, 16. More particularly, the sum of the impedances of resistors R1 and R2 is made equal to the impedance of transmission line 14, 16 so that ringing caused by the transmission line is suppressed. If the impedance-matched H-bridge has a common mode or is strongly coupled to a ground plane, resistors R1 and R2 should be equal to provide symmetry around the transmission line and head. Otherwise, resistors R1 and R2 may be unequal for asymmetrical transmission lines and heads. In either case, the sum of the resistances of resistors R1 and R2 should equal the sum of the resistances of the transmission line and head to suppress ringing.

The present invention thus provides a low-impedance, voltage-mode H-bridge that operates for a rapid rise time of the transitions in the write current pulses. The voltage-mode H-bridge provides supply-limited voltages of Vcc of Vee to terminals 10 and 12, assuring a high voltage for rapid current rise time. By reversing the voltage of the voltage-mode H-bridge, overshoot may be augmented and undershoot suppressed. After the voltage-mode H-bridge is tri-state or turned off, and the impedance-matched H-bridge controls the write current through the coil of the head. The impedance-matched H-bridge is impedance matched to the differential characteristics of the transmission line that it drives, resulting in zero differential reflections on terminals 10 and 12. The present invention thus provides a highly efficient write driver for an inductive magnetic write head.

Although the present invention has been described with reference to preferred embodiments, workers skilled in the art will recognize that changes may be made in form and detail without departing from the spirit and scope of the invention. More particularly, while the circuit has been described using bipolar technology, it is clear that MOSFETs and other semiconductor technology may be used in place of pnp and npn transistors. Likewise, the particular configuration of the transistors of the H-bridge may be varied to suit particular requirements without departing from the invention. Moreover, while the invention has been described in connection with an H-bridge that is impedance matched to the transmission line to the load and a voltage-mode H-bridge that injects voltage into the load terminals to minimize write current rise times, the voltage-mode H-bridge may be used with other driver circuits to minimize load current rise times, and the impedance-matched H-bridge may be used alone or with other circuits to minimize load current ringing.

What is claimed is:

1. A write driver for an inductive load comprising:

first and second load terminals for connection to an inductive load;

a driver connected to the first and second load terminals and responsive to a first control signal to supply a drive current through the load from the first load terminal to the second load terminal and responsive to a second control signal to supply the drive current through the load from the second load terminal to the first load terminal;

a voltage-mode H-bridge connected to the first and second load terminals, the voltage-mode H-bridge being responsive to the first control signal to supply a first voltage to the first load terminal and a second voltage to the second load terminal and responsive to the second control signal to supply the first voltage to the second load terminal and the second voltage to the first load terminal; and program means responsive to the first and second control signals and configured to operate the voltage-mode H-bridge to cease supply of the first and second voltages to the respective first and second load terminals upon expiration of a predetermined time period following an initiation of the respective first and second control signal.

2. The write driver of claim 1, wherein the program means operates the voltage-mode H-bridge to reverse the supply of the first and second voltages to the first and second load terminals upon expiration of the predetermined time period.

3. The write driver of claim 1, wherein the voltage-mode H-bridge comprises first, second, third and fourth transistors each having first and second controlled elements and a control element, a first controlled element of the first and second transistors being connectable to a first voltage source and a first controlled element of the third and fourth transistors being connectable to a second voltage source, a second controlled element of the first and third transistors being connected together and to the first load terminal, and a second controlled element of the second and fourth transistors being connected together and to the second load terminal the program means being connected to the control element of each of the first, second, third and fourth transistors and configured to operate the first, second, third and fourth transistors to operate to provide supply-limited first and second voltages to the respective first and second load terminals for the predetermined time period.

4. The write driver of claim 3, wherein the program means comprises first, second, third and fourth program units each connected to the control element of a respective first, second, third and fourth transistor, the first and fourth program units being responsive to initiation of the first control signal to operate the first and fourth transistor to a conducting state for the predetermined period of time, and the second and third program units being responsive to initiation of the second control signal to operate the second and third transistors to a conducting state for the predetermined period of time.

5. The write driver of claim 4, wherein the first, second, third and fourth program units each operate the respective transistor to a non-conducting state a predetermined time after operating the transistor to a conducting state.

6. The write driver of claim 4, wherein the first and fourth program units are further responsive to initiation of the second control signal to operate the first and fourth transistors to a conducting state for a second period of time after expiration of the first-named predetermined time period, and the second and third program units are further responsive to initiation of the first control signal to operate the second and third transistors to a conducting state for the second period of time after expiration of the first-named predetermined time period.

7. The write driver of claim 6, wherein the first, second, third and fourth program units each operate the respective transistor to a non-conducting state upon expiration of the respective first and second predetermined time period of operating the transistor to a conducting state.

8. The write driver of claim 7 wherein the inductive load includes an inductive write head and a transmission line connected to the write head for connection to the first and second load terminals, the transmission line having a predetermined propagation time of signals between the load terminals and the head, the sum of the first and second predetermined time periods being no greater than twice the predetermined propagation time of the transmission line.

9. The write driver of claim 1 wherein the inductive load includes an inductive write head and a transmission line connected to the write head for connection to the first and second load terminals, the transmission line having a predetermined propagation time of signals between the load terminals and the head, the predetermined time period of operation of the voltage-mode H-bridge being no greater than twice the predetermined propagation time of the transmission line.

10. The write driver of claim 9, wherein the transmission line has a predetermined impedance, and the driver includes an impedance matched to the impedance of the transmission line.

11. The write driver of claim 10, wherein the driver comprises an impedance-matched H-bridge connected to the first and second load terminals and responsive to the first control signal to supply drive current to the first load terminal and sink drive current from the second load terminal and responsive to the second control signal to supply drive current to the second load terminal and sink drive current from the first load terminal, the impedance-matched H-bridge having an impedance matched to the impedance of the transmission line.

12. The write driver of claim 11, wherein the impedance-matched H-bridge comprises fifth, sixth, seventh and eighth transistors each having first and second controlled elements and a control element, a first controlled element of the fifth and sixth transistors being connectable to a third voltage source and a first controlled element of the seventh and eighth transistors being connectable to a fourth voltage source, a second controlled element of the fifth and seventh transistors being connected together, and a second controlled element of the sixth and eighth transistors being connected together, and the impedance comprises a first impedance connected between first load terminal and the junction of the fifth and seventh transistors and a second impedance connected between the second load terminal and the junction of the sixth and eighth transistors, the first and second impedances having substantially equal impedance values.

13. The write driver of claim 11, wherein the impedance-matched H-bridge is responsive to the respective first and second control signals to supply drive current to the respective first and second load terminals and sink drive current from the respective second and first load terminals for a period of time of about twice the predetermined time period of operation of the voltage-mode H-bridge.

14. The write driver of claim 11, wherein at least one of the first and second control signals to which the impedance-matched H-bridge is responsive has a predetermined voltage, the voltage-mode H-bridge being responsive to the predetermined voltage so that at least one of the first and second voltages supplied to the respective first or second load terminal is based on the predetermined voltage.

* * * * *